United States Patent
Niebauer

(10) Patent No.: US 6,923,692 B2
(45) Date of Patent: Aug. 2, 2005

(54) ELECTRICAL CONNECTORS INCORPORATING LOW FRICTION COATINGS AND METHODS FOR MAKING THEM

(75) Inventor: Daniel A. Niebauer, Camarillo, CA (US)

(73) Assignee: Yazaki Corporation, Tokyo (JP)

( * ) Notice: Subject to any disclaimer, the term of this patent is extended or adjusted under 35 U.S.C. 154(b) by 147 days.

(21) Appl. No.: 10/420,336

(22) Filed: Apr. 22, 2003

(65) Prior Publication Data

US 2003/0219622 A1 Nov. 27, 2003

Related U.S. Application Data

(60) Provisional application No. 60/374,665, filed on Apr. 22, 2002.

(51) Int. Cl.$^7$ .......................... B32B 15/00; C23C 14/16; C23C 14/34; H01R 13/03
(52) U.S. Cl. ................. 439/886; 428/646; 428/647; 428/648; 428/615; 428/929; 204/192.16; 204/192.17; 29/874
(58) Field of Search ................ 428/929, 646, 428/647, 648, 639, 472, 615, 938; 439/886; 204/192.17, 192.16; 29/874

(56) References Cited

U.S. PATENT DOCUMENTS

| | | | | |
|---|---|---|---|---|
| 3,482,202 A | * | 12/1969 | Hamilton, Jr. et al. ...... | 439/114 |
| 3,732,158 A | * | 5/1973 | Przybyszewski et al. ..................... | 204/298.05 |
| 4,925,394 A | | 5/1990 | Hayashi et al. ................ | 439/86 |
| 5,028,492 A | | 7/1991 | Guenin ........................ | 428/614 |
| 5,141,702 A | * | 8/1992 | Guenin et al. ................. | 419/8 |
| 5,316,507 A | | 5/1994 | Capp ........................... | 439/886 |
| 5,370,778 A | * | 12/1994 | Koo et al. ............. | 204/192.15 |
| 5,667,659 A | | 9/1997 | Souza et al. ................. | 205/109 |
| 5,679,471 A | | 10/1997 | Cheng et al. ................ | 428/673 |
| 5,780,172 A | * | 7/1998 | Fister et al. ................. | 428/647 |
| 5,849,424 A | | 12/1998 | Sugawara et al. .......... | 428/674 |
| 5,853,557 A | | 12/1998 | Souza et al. ................. | 205/109 |
| 5,916,695 A | | 6/1999 | Fister et al. ................. | 428/647 |
| 5,967,860 A | | 10/1999 | Ricketts et al. ............. | 439/886 |
| 6,007,390 A | | 12/1999 | Cheng et al. ............... | 439/886 |
| 6,136,460 A | * | 10/2000 | Chen et al. .................. | 428/699 |
| 6,183,886 B1 | | 2/2001 | Chen et al. | |
| 6,355,366 B1 | * | 3/2002 | Santini ........................ | 428/698 |
| 6,423,419 B1 | * | 7/2002 | Teer et al. ................... | 428/469 |
| 2004/0211672 A1 | * | 10/2004 | Ishigami et al. ............ | 205/131 |

FOREIGN PATENT DOCUMENTS

EP    0 842 306 B1    1/2000

OTHER PUBLICATIONS

Stupp, Bernard C., "Synergistic Effects of Metals Co–Sputtered with MoS," *Thin Solid Films*, 1981, vol. 84, pp 257–266.

Simmonds, M.C. et al., "Mechanical and Tribological Performance of MoS Co–Sputtered Composites," Surface and Coatings Technology, vol. 126, 2000, pp 15–24.

\* cited by examiner

*Primary Examiner*—John J. Zimmerman
(74) *Attorney, Agent, or Firm*—Sheppard, Mullin Richter & Hampton

(57) ABSTRACT

Electrical connectors incorporate a composite coating of molybdenum disulfide and a metal, preferably tin, for one or both of the contact surfaces of the electrical connector. The coating provides for a low coefficient of friction, low contact resistance, and good electrical conductivity, as well as good mechanical properties. The coating also reduces the insertion force of the electrical connectors, thereby increasing the number of possible terminal pairs and/or reducing terminal bending and breakage for a manually mated connector. The coating can be deposited on copper, tin-plated copper, tin alloy-plated copper or other metallic substrates, using any of several physical vapor deposition methods.

51 Claims, No Drawings

ELECTRICAL CONNECTORS INCORPORATING LOW FRICTION COATINGS AND METHODS FOR MAKING THEM

Priority is claimed from pending U.S. Provisional Patent Application Ser. No. 60/374,665, filed Apr. 22, 2002, herein incorporated by reference.

BACKGROUND OF THE INVENTION

This invention relates generally to coatings for electrical conductors and, more particularly, to such coatings that provide for low friction to reduce connector insertion forces. This invention also relates to methods for making connectors incorporating such coatings.

Conventional electrical connectors, such as automotive connectors having terminals made of tin-plated copper alloys, are designed so that a normal (i.e. compressive) force acts on the contacting surfaces of the connectors when they are in service. This force provides for low contact resistance leading to good electrical conductivity through the connector. A consequence of this normal force is that a significant insertion force is required to mate the male and female connector pair. The amount of insertion force required per terminal imposes a limitation on the number of terminals or circuits that can be manually connected simultaneously, because of the limit to the amount of force that can be applied. For example, a typical automotive connector is specified to receive a maximum of about 75 Newtons of insertion force. For a terminal made from traditional tin (Sn)-plated copper (Cu) alloy having a cross-section of about 0.4 $mm^2$, this maximum imposes a practical limitation of about 30 to 40 terminal pairs in a manually-mated connector.

Due to the general increase in the number and complexity of electronic components and systems used in the automotive, computer, and telecommunications fields, a need exists for increasing the number of circuits per connector without significantly increasing the mating force required to join these additional circuits. Additionally, this increase in the number of components leads to a need for reducing connector size, and therefore terminal cross-section area. However, a reduction in connector size can lead to an increase in the occurrence of damages to connectors, such as from terminal bending or breakage, upon connector insertion.

Two basic approaches have been used previously to reduce or eliminate the insertion forces discussed above. The first approach seeks to solve this insertion force problem through use of mechanical designs, such as zero-insertion force (ZIF) connector designs. However, ZIF connectors are not routinely used in automotive or other demanding services, due to their complexity, cost, and inability to meet the environmental requirements of these services.

The second approach seeks to obtain low-insertion force (LIF) connectors by use of lubricants or low-friction materials. A number of lubrication methods have been devised to reduce insertion force by coating the terminal to produce a low-friction surface. One method has involved coating connectors or terminals with liquid lubricants to reduce necessary insertion force. However, these liquid lubricants can yield hazardous vapors, especially during their application. They also can migrate, evaporate, or gather dust and contamination. This can lead to degraded electrical and mechanical performance of the connector and associated electrical components over extended periods of time.

In view of the difficulties described above, use of thin film coatings of solid lubricants is considered to be better than use of liquid lubricants. Solid coatings solve the insertion force problem by providing the contact surfaces of electrical connectors with low coefficients of friction (COF) and low contact resistance (CR). Low COF minimizes insertion force and low CR reduces electrical losses, as well as prevents damage to connectors from excessive heating of the contact area due to low electrical conductivity. Specifically, these solid thin films preferably should provide COF levels of lower than 0.2, more preferably lower than 0.1, and most preferably lower than 0.08 to solve the high insertion force problem. At the contact surfaces of the terminals, the coatings also preferably should provide CR levels of less than 20 milliohms, more preferably less than 10 milliohms, and most preferably less than 8 milliohms. This solid coating should be made of a sufficiently wear-resistant material to withstand the wear and tear caused by multiple coupling and decoupling of the connectors, as well as by vibration present in automotive environments.

The most common materials used in manufacturing electrical connectors are copper and copper alloys, due to their high electrical conductivity and low cost. However, copper can easily oxidize, and its conductivity can thereby quickly degrade with time. Coating of copper with inexpensive electroplating materials, such as tin (Sn), lead (Pb), and tin-lead alloys, is known to prevent this oxidation. However, copper coated with these conventional electroplating materials typically has an unacceptably high COF level higher than 0.4. Tin-plated copper also cannot withstand the wear and tear caused by multiple terminal engagements, due to its softness. Such materials therefore are not suitable for use on LIF terminals. For example, U.S. Pat. No. 5,849,424 to Sugawara et al. entitled "Hard Coated Copper Alloys, Process for Production Thereof and Connector Terminals Made Therefrom" proposes numerous terminal coatings essentially consisting of copper, tin, nickel (Ni), and phosphorous (P). Another approach described in U.S. Pat. No. 4,925,394 to Hayashi et al. entitled "Ceramic-Coated Terminal for Electrical Connection" discloses a ceramic coating that has greater wear resistance than the uncoated copper terminal. Although such coatings can have sufficient hardness to withstand the wear and tear caused by multiple couplings, and have low CR, they do not have sufficiently low COF levels for use in the LIF applications discussed above. Ceramic coatings are so hard that they cause rapid wear of stamping dies used to make electrical terminals from coated copper strips, and they also may crack under the force of terminal mating.

Coatings of noble metals, such as gold (Au), silver (Ag), or platinum (Pt), also have been applied to copper terminals to prevent their oxidation. Although noble metals have very low CR levels, they are too expensive for use in common electrical connectors. Furthermore, noble metals also have a relatively high COF. For gold coatings engaged against gold coatings, the self-COF (i.e. gold-on-gold) level reaches values higher than 1.0. Although silver (Ag) coatings are less expensive than gold, they also generally are characterized by high self-COF values in the range of 0.8 to 1.2 for bulk silver, and 0.2 to 0.3 for silver coatings incorporating microcrystalline structures. Furthermore, silver coatings are not highly resistant to corrosion. As a result, silver coatings are unsuitable for prolonged operation, especially in corrosive environments.

The above oxidation-resistant but high-COF coatings, or their alloys, are combined with solid lubricants, such as graphite, and various plastics, such as polyamide, polyimide, and particularly polytetrafluoroethylene (PTFE), to form composite coatings having decreased COF levels. To increase wear resistance, materials such as nickel or titanium (Ti) also are added into these composite coatings. For example, U. S. Pat. No. 5,316,507 to Capp entitled "Noble Metal and Solid-phase Lubricant Composition and Electrically Conductive Interconnector" discloses several composites of noble metals incorporating graphite particles. The noble metal is selected from gold, silver, platinum, palladium, or alloys of these. The noble metal content of these coatings is higher than 95 weight percent. U.S. Pat. No. 5,679,471 to Cheng et al. entitled "Silver-Nickel Nanocomposite Coating for Terminals of Separable Electrical Connectors" describes a coating having low CR and improved wear resistance. The COF of one such coating, $Ag_{81}Ni_{19}$, is 0.5 at 2 Newtons load, with a CR of about 20 milliohms. These coatings should have silver content preferably higher than 40 atomic percent, and most preferably higher than 73 atomic percent, to achieve the desired high electrical conductivity and wear resistance. U.S. Pat. No. 5,967,860 to Ricketts et al. entitled "Electroplated Ag—Ni—C Electrical Contacts" discloses electrodeposited silver-nickel-carbon coatings having CR levels in the range of 1 milliohm to 10 milliohms. The silver content of these coatings is higher than 60 atomic percent. Although some compositions of noble metal-solid lubricant composite coatings mentioned above have both low COF and low CR levels, their high noble metal contents make them too expensive for use in common electrical connectors. Therefore, they are economical only for use in special, high reliability applications.

U.S. Pat. No. 6,007,390 to Cheng et al. entitled "Low Friction Metal-Ceramic Composite Coatings for Electrical Contacts" discloses ceramic-metal composite coatings for electrical contacts. The composite coatings of silver or gold with titanium nitride (TiN), co-deposited by physical vapor deposition, have CR levels varying in the range of 1.9 milliohms to 4.4 milliohms at 5 Newtons load. The COF of TiN-silver on titanium level is higher than 0.2 at 1 Newton load. The noble metal content of these composite coatings varies between 1 and 10 atomic percent. Although these coatings are economically more attractive than the noble metal composite coatings discussed above, due to their lower noble metal contents, their COF levels are higher than those required for LIF connectors.

U.S. Pat. No. 5,028,492 to Guenin entitled "Composite Coating for Electrical Connectors" describes metal-polymer particle composite coatings prepared by plating technique. A metal is selected from tin, lead, tin-lead, tin-indium, or tin-silver alloys. The polymer is selected from polyimide, polyamide, or PTFE. The polymer content of these composite coatings is kept below 0.7 weight percent to provide high electrical conductivity. The initial CR of these composite coatings varies in the range of 2 milliohms to 10 milliohms. The frictional force of these coatings varies in the range of 3 gmf to 25 gmf U.S. Pat. Nos. 5,667,659 entitled "Low Friction Solder Electrodeposits" and 5,853,557 entitled "Low Friction, Ductile, Multilayer Electrodeposits," both to Souza et al, describe composite coatings of tin, lead, or tin-lead alloys incorporating PTFE particles, which are prepared using an electrodeposition process. These coatings have COF levels in the range of 0.06 to 0.75 at 100 grams load, and CR levels in the range of 1.2 milliohms to 2.6 milliohms. The polymer particle content of such composite coatings should be very low, preferably lower than 1 weight percent to provide low CR values. Controlling the particle content of these coatings at such low levels by using the polymer particle metal composite plating processes mentioned above is difficult.

Molybdenum disulfide ($MoS_2$) also is known as a solid lubricant in the form of dry powder, a solid coating, or a thin film, or in a mixture with greases. $MoS_2$ is known to contribute to very low COF surfaces in bearings and cutting tools. Pure molybdenum sulfide (i.e. $MoS_x$ where $x \leq 2$) coatings are known to yield COF levels as low as 0.01 at 5 Newtons load. However, a moist environment quickly deteriorates the lubricating properties of pure molybdenum sulfide coatings causing the COF to increase above 0.15. To overcome this environmental limitation, $MoS_2$-metal composites have been developed, as taught, for example, by B. C. Stupp in *Thin Solid Films*, vol. 84, pp. 257–266 (1981) entitled "Synergistic Effects of Metals Co-Sputtered with $MoS_2$". Stupp discloses composites of $MoS_2$ and a variety of metals and metal alloys, including aluminum (Al), chromium (Cr), cobalt (Co), molybdenum (Mo), nickel, platinum, silver, gold, tantalum (Ta), tungsten (W), brass, and bronze. Stupp also teaches that chromium, cobalt, nickel, and tantalum are preferred metals for forming composites with $MoS_2$. U.S. Pat. No. 6,423,419 to D. Teer et al., entitled "Molybdenum-sulphur coatings" cites the use of numerous $MoS_2$-metal composites, including those of $MoS_2$ and titanium, zirconium (Zr), hafnium (Hf), tungsten, niobium (Nb), platinum, vanadium (V), tantalum, chromium, molybdenum, and gold. Likewise, other $MoS_2$ composites have been taught by Stupp and by M. C. Simmonds, et al. in *Surface and Coatings Technology* vol. 126, pp 15–24 (2000) entitled "Mechanical and tribological performance of $MoS_2$ co-sputtered deposits". These composites include $MoS_2$ combined with the metals such as silver, aluminum, gold, iron (Fe), platinum, lead, nickel, or copper, or also with compounds such as antimony oxide ($Sb_2O_3$) and tungsten selenide ($WSe_2$). All of these $MoS_2$-metal composites are for use in tooling or bearings, where low friction and high wear resistance in humid environments is required.

None of the above publications disclose a $MoS_x$-metal composite coating having a low CR level that is suitable for electrical connectors. In its pure form, $MoS_2$ does not exhibit the electrical conductivity levels required for use in electrical conductors. As for the composite coatings incorporating $MoS_2$ particles, U.S. Pat. No. 5,028,492 to Guenin, entitled "Composite Coating for Electrical Connectors," explains that a tin-PTFE composite performs better than a particle composite of 99 weight percent tin and 1 weight percent $MoS_2$ in the fretting test.

It should be appreciated from the foregoing description that there is a need for an improved coating for electrical contacts exhibiting high electrical conductivity (i.e., low CR), and low insertion force (i.e., low COF). The present invention fulfills this need and provides further related advantages.

SUMMARY OF THE INVENTION

The present invention is embodied in an electrical connector incorporating a male terminal and a female terminal, the male and female terminals each made from a substrate material. The male and female terminals each have contact surfaces, and at least a portion of the contact surfaces of the female terminal or the male terminal (preferably the male terminal) are coated by a solid thin film comprising a $MoS_x$-metal composite material. In the formula for $MoS_x$, "x" is the atomic ratio of sulfur to molybdenum in the $MoS_x$-metal composite material and preferably has a value from about 1.0 to about 2.0.

The substrate material preferably is selected from the group consisting of copper, copper alloy, tin-plated copper, tin plated copper alloy, tin alloy-plated copper, tin alloy-plated copper alloy, tin-plated brass, nickel-plated copper, nickel-plated copper alloy, nickel-plated brass, brass, silver, nickel, iron-nickel alloy, and silver-nickel alloy. More preferably, the substrate material is selected from the group consisting of copper, copper alloy, tin-plated copper, and tin-plated copper alloy. In a preferred embodiment, the substrate material is in the form of a strip, and the male terminal or female terminal is prepared using forming or stamping of the substrate material.

The $MoS_x$-metal composite material incorporates a metal preferably selected from the group consisting of tin, titanium, zirconium, chromium, cobalt, nickel, tungsten, tantalum, niobium, hafnium, and alloys of these. The most preferred metal is tin. The solid thin film preferably incorporates between about 2 weight percent and about 20 weight percent of the metal, and more preferably between about 2 weight percent and about 14 weight percent of the metal. The solid thin film preferably has a thickness of between about 0.05 $\mu$m and about 2.0 $\mu$m, and more preferably between about 0.1 $\mu$m and about 1.0 $\mu$m.

In a preferred embodiment of the present invention, the portion of the contact surfaces of the female terminal or the male terminal are further coated by a thin intermediate metal layer deposited between the contact surfaces and the solid thin film of the $MoS_x$-metal composite. This thin intermediate metal layer preferably incorporates titanium, chromium, or zirconium, and more preferably titanium or chromium. The thin intermediate metal layer preferably has a thickness between about 0.005 $\mu$m and about 0.2 $\mu$m.

The solid thin film preferably has a coefficient of friction of less than about 0.2 at a normal load of about 5 Newtons, more preferably less than about 0.1 and most preferably less than about 0.08. The solid thin film has a contact resistance of less than about 20 milliohms at a normal load of about 5 Newtons, more preferably less than about 10 milliohms, and most preferably less than about 8 milliohms.

The present invention also resides in a method for making an electrical connector as described above incorporating the following steps: 1) pre-cleaning the substrate material; 2) placing the substrate material in a vacuum deposition chamber having a refrigerated trap; 3) evacuating the vacuum deposition chamber to a pressure less than about $7.5\times10^{-4}$ millitorr; 4) cooling the refrigerated trap to a temperature less than 150 Kelvin; and 5) coating the substrate material with the $MoS_x$-metal composite material to form a solid thin film having a predetermined thickness.

In preferred aspects of the method, the vacuum deposition chamber has at least one sputter deposition source, and the vacuum deposition chamber can be equipped to provide for continuous motion of the substrate material relative to the sputter deposition sources. The step of coating preferably incorporates using a physical vapor deposition process to coat the substrate material with the $MoS_x$-metal composite material, preferably by sputtering from at least one target to coat the substrate material. The step of depositing preferably incorporates using a balanced planar magnetron to coat the substrate material. The step of depositing also preferably incorporates powering the sputter deposition source in the chamber by direct current, mid-frequency alternating current, alternating current, pulsed current, radio frequency, or microwave energy, more preferably by direct current or mid-frequency alternating current, and most preferably by direct current.

In the method of the present invention, the step of coating preferably incorporates either: 1) sputtering from a single target consisting essentially of $MoS_2$-metal composite material; 2) sputtering simultaneously from at least one target consisting essentially of $MoS_2$ and at least one target consisting essentially of metal; or 3) sputtering from at least one target consisting essentially of molybdenum or $MoS_2$, and at least one target consisting essentially of metal sulfide. When a single target is used, the step of coating preferably incorporates sputtering from a target prepared by hot pressing of $MoS_2$ powder along with a metal powder or metal sulfide powder. This preferably incorporates a target prepared by hot pressing of $MoS_2$ powder along with tin powder at a temperature below about 232° C., or by hot pressing of $MoS_2$ powder along with a powder of SnS or $SnS_2$.

In the method of the present invention, the step of coating preferably incorporates providing a power density at the target or targets in the range of 2 W/cm$^2$ to 12 W/cm$^2$. The step of coating also preferably incorporates admitting argon to the chamber in an amount sufficient to increase the chamber pressure to a level between 0.25 millitorr and 7.5 millitorr, more preferably between 0.5 millitorr and 3.0 millitorr, and most preferably between between 0.75 millitorr and 1.5 millitorr. In another aspect of this invention, the step of coating incorporates coating using a reactive deposition process, preferably a process in which deposition is from reaction of a gaseous sulfur compound with molybdenum and the metal target. The gaseous sulfur compound preferably is $H_2S$ or a vapor of elemental sulfur.

In the method, the predetermined thickness of the solid thin layer preferably is between about 0.05 $\mu$m and about 2.0 $\mu$m, and more preferably between about 0.1 $\mu$m and about 1.0 $\mu$m. In a preferred aspect, the method further incorporates a step of coating the substrate material with chromium, titanium, or zirconium to form a thin intermediate metal layer having a predetermined thickness, before the step of coating the substrate material with the solid thin film of $MoS_x$-metal composite material. The predetermined thickness of the thin intermediate metal layer is between about 0.005 $\mu$m and about 0.2 $\mu$m. In another preferred aspect, the method further incorporates using an ion source for fine-cleaning the substrate by bombarding the substrate with $Ar^+$ ions before the step of coating the substrate material with the $MoS_x$-metal composite material. In the method, the substrate material preferably is in the form of a thin strip.

The present invention also resides in a method for making an electrical connector comprising a male terminal and a female terminal, the male and female terminals each comprising a substrate material and contact surfaces, in which at least a portion of the contact surfaces of the female terminal or the male terminal are coated by a solid thin film comprising a $MoS_x$—Sn composite material, in which "x" is the atomic ratio of sulfur to molybdenum in the $MoS_x$-metal composite material, the method incorporating the following steps:

1) providing the substrate material in the form of a thin strip; pre-cleaning the substrate material;

2) placing the substrate material in a vacuum deposition chamber having a refrigerated trap;

3) evacuating the vacuum deposition chamber to a pressure less than about $7.5\times10^{-4}$ millitorr;

4) cooling the refrigerated trap of the chamber to a temperature less than 150 Kelvin;

5) admitting argon in the chamber in an amount sufficient to increase the pressure in the vacuum deposition chamber to a level between 0.25 millitorr and 7.5 millitorr;

6) fine-cleaning the substrate material by bombarding the substrate material with Ar⁺ ions;

7) coating the substrate material with titanium or chromium to form a thin intermediate metal layer having a thickness between 0.005 μm and 0.2 μm; and 8) coating the substrate material using sputter deposition from a balanced planar magnetron with a MoS$_2$—Sn composite target composite material to form solid thin film having a thickness between 0.1 μm and 1.0 μm. In this aspect of the present invention, the MoS$_2$—Sn composite target is manufactured by hot pressing of MoS$_2$ powder and tin powder at a temperature below 232° C., and wherein the magnetron is powered by a direct current power supply at a power density between 2 W/cm² and 12 W/cm².

DETAILED DESCRIPTION OF THE PREFERRED EMBODIMENTS

The present invention resides in an electrical connector having contact surfaces of its female and/or male terminals coated with a solid thin film coating consisting essentially of a particular composite material of molybdenum sulfide and a metal. The present invention also resides in related methods for making terminals incorporating this coating. The metal composite hereafter is referred to as "MoS$_x$-metal", where "x" is the atomic ratio of sulfur to molybdenum and preferably has a value of $1.0 \leq x \leq 2.0$. Use of the coating provides for electrical connector terminals having an advantageous combination of low COF, low CR, low cost, and sufficient wear resistance to allow multiple mating and unmating actions.

The coating of the present invention can be applied to contact surfaces of either female or male terminals, or both. Since MoS$_x$-metal is known to decrease electrical conductivity (and therefore increase CR), this coating preferably is applied to the contact surface of only one of the two terminal types. The male terminal is commonly manufactured by stamping and folding in such a manner that a coating deposited on one side of the strip substrate ends up on both the top and bottom of the blade of the fabricated male terminal. Cost can be decreased by coating only one side of the substrate material and by manufacturing male terminals from this substrate material. The coating most preferably is therefore applied to the contact surface of the male terminal.

The coating of the present invention incorporates an atomic or molecular composite of MoS$_x$ with a metal or mix of metals. These metals are selected from tin, titanium, zirconium, chromium, cobalt, nickel, tungsten, tantalum, niobium, hafnium, and their alloys. In particular, MoS$_x$—Sn composite coatings within the scope of the present invention are softer and relatively more compliant when compared to some known MoS$_2$-metal composite coatings. This is of particular mechanical property advantage for electrical connector fabrication, because the bending, folding, and other forming operations in these applications do not cause these coatings to flake or debond, as would occur for harder coatings. Moreover, since MoS$_x$—Sn coatings are softer relative to some known MoS$_2$-metal composite coatings, they cause less wear of the stamping and forming dies used to prepare electrical terminals. Also, the MoS$_x$—Sn composite coatings of this invention are comparatively more compatible with connectors made from traditional tin-plated and tin-alloy (e.g., solder) plated copper alloys, because stable MoS$_x$—Sn composites can be deposited on tin-plated metals with no or minimal adhesion problems. Therefore, MoS$_x$—Sn composites are most preferred coatings for these applications.

The metal content of the MoS$_x$-metal composite coating preferably is between 2 weight percent and 20 weight percent, and most preferably between 4 weight percent and 14 weight percent. A metal content of the coating below about 20 weight percent allows the coating to successfully survive static and dynamic loading and linear motion similar to that present during the mating of electrical connectors. A metal content above about 2 weight percent allows for contact resistance suitably low for use in electrical connectors. The thickness of the MoS$_x$-metal composite coating preferably is in the range of 0.05 μm to 2.0 μm, and most preferably in the range of 0.1 μm to 1.0 μm. Thinner coatings are preferable for providing higher electrical conductivity. However, coatings that are too thin cannot survive the wear and tear caused by multiple engagements.

In a preferred embodiment of this invention, a thin intermediate metal layer, made of titanium, chromium, or zirconium is situated between the substrate material and the MoS$_x$-metal composite coating. This intermediate metal layer is used to ensure adhesion of the MoS$_x$-metal composite coating to copper or other metal substrates. Such an intermediate metal layer coating also is advantageous for improving the strength and hardness of the MoS$_x$-metal composite coating, particularly when the coating is deposited on soft substrate materials, such as tin-plated copper. This intermediate metal layer preferably has a thickness in the range of 0.005 μm to 0.2 μm.

The MoS$_x$-metal composite coating of the present invention can be deposited on any electrical terminal substrate material, including copper, copper alloy, tin-plated copper, tin-plated copper alloy, tin alloy-plated copper, tin alloy-plated copper alloy, tin-plated brass, nickel-plated copper, nickel-plated copper alloy, nickel-plated brass, brass, silver, nickel, iron-nickel alloy, silver-nickel alloy, or other suitable electrical terminal substrate material. The substrate should have a shape suitable for manufacturing of connector terminals from the substrate. Examples of suitable substrate shapes include thin, long strips, thin sheets, and thin coupons, all of which are within the scope of this invention. Substrates in the shape of thin, long strips are most preferred.

Another preferred aspect of this invention resides in a method for cleaning and coating an electrical terminal substrate material. The cleaning method includes a step of pre-cleaning, comprising several sub-steps. First, the substrate is washed using solvents, such as acetone, isopropanol, ethanol, toluene, chlorinated solvent, or mixtures of these. Then, the substrate is cleaned using a dilute solution of detergent or soap in deionized water in an ultrasonic cleaner. After rinsing with deionized water, the substrate material is dried in an air or nitrogen stream. In one aspect of this method, the step of pre-cleaning includes cleaning the dried substrate material using a sprayed snow of carbon dioxide.

After the steps of pre-cleaning described above, the substrate is placed in a high vacuum sputter deposition chamber. Before the deposition of the coating, the method preferably further includes a step of fine-cleaning of the substrate by bombardment of Ar⁺ ions in this deposition chamber.

In another preferred aspect of this invention, this deposition chamber is further equipped to provide for continuous motion of the strip substrate relative to the sputter deposition sources. During the deposition, the strip substrate preferably is continuously unwound from a supply reel, and drawn past an ion cleaning station and two sputter deposition stations, to a take-up reel.

Deposition of the coating can be achieved using any of several known physical vapor deposition (PVD) methods. Commonly used PVD methods include evaporation and sputtering from a suitable source. The PVD also can be achieved using cathodic arc deposition and ion beam deposition. Deposition of the solid thin film by simultaneous sputtering from separate $MoS_2$ and metal targets; sputtering from a single target composed of $MoS_2$-metal; and sputtering from a molybdenum metal or $MoS_2$ target along with a metal sulfide target is within the scope of this invention. The sputter deposition source can be powered by any known technique such as direct current (DC), mid-frequency alternating current, alternating current (AC), pulsed current, radio frequency (RF), and microwave energy. Such techniques are known to yield $MoS_x$ coatings in which x is within the range of about 1.0 to about 2.0 inclusive.

In a preferred method, deposition of the solid thin film of the $MoS_x$-metal composite is achieved by using a balanced planar magnetron, powered by either DC or mid-frequency AC (20–500 KHz) at a power density in the range of preferably 2 $W/cm^2$ to 12 $W/cm^2$. For this deposition, the sputter target attached to the planar magnetron preferably is a rectangular plate made by hot-pressing of a thoroughly blended mixture of $MoS_2$ powder and metal powder. Alternatively, a suitable target also can be made by hot-pressing a thoroughly blended mixture of $MoS_2$ powder and metal sulfide powder. The most preferred targets include: an $MoS_2$—Sn target, manufactured by hot-pressing of $MoS_2$ powder and tin powder at temperatures generally below the melting point of tin (232° C.); and, a molybdenum sulfide-tin sulfide target, manufactured by hot pressing of $MoS_2$ powder and SnS or $SnS_2$ powder. The ratio of the powder used as a source of metal to the powder used as a source of molybdenum is adjusted to provide the desired metal content in the deposited coating. Such targets can be obtained from Pure Tech, a subsidiary of Williams Advanced Materials of Brewster, N.Y.

In another embodiment of this invention, the $MoS_x$-metal coating also can be deposited using reactive physical deposition methods. In reactive deposition, the sulfur content of the coating is derived from a gaseous source, such as $H_2S$ or a vapor of elemental sulfur, and the molybdenum and metal content from metallic sputter targets by following the methods taught by A. Aubert et al., in "Preparation and Properties of $MoS_x$ Films-Grown by D. C. Magnetron Sputtering", *Surface Coatings and Technology*, vol. 41, pp. 127–134 (1990) or evaporation sources.

The coating chamber discussed above is further equipped to provide a pressure of lower than about $7.5 \times 10^{-4}$ millitorr and a refrigerated trap having a surface temperature lower than about 150 Kelvin. Application of such low pressures and use of a cold trap is crucial for removing residual water vapor, thereby minimizing or completely preventing the reaction between the water vapor and $MoS_x$, to obtain coatings having improved COF and CR properties.

During the application of the coating, the chamber first is evacuated to an initial pressure of lower than about $7.5 \times 10^{-4}$ millitorr and the cold trap is refrigerated to a temperature lower than about 150 Kelvin. This ensures minimization of the residual water content of the chamber. After this initial evacuation step, gaseous argon is admitted to the chamber to increase the pressure so that argon plasma is obtained when the power is applied. Higher argon pressures are essential for providing stable argon plasma. However, lower argon pressures are favorable for achieving higher energies of sputtered atoms, leading to a higher density coating. In view of these competing concerns, the argon pressure is controlled to preferably be within a range of 0.25 millitorr to 7.5 millitorr, more preferably 0.5 millitorr to 3.0 millitorr, and most preferably 0.75 millitorr to 1.5 millitorr. Next, the ion source and sputter deposition sources are activated, and the coating process is initiated.

At the ion cleaning station, the substrate is bombarded with $Ar^+$ ions to achieve the step of fine-cleaning by removing the adsorbed water layer and the metal oxide on the surface of the substrate. These ions preferably are generated by high-voltage glow discharge, more preferably an ion source, and most preferably an anode-layer ion beam source. In one aspect of the method, the substrate then is coated at the first sputter station with a thin intermediate layer of chromium, titanium, or zirconium. The film thickness is varied in the range of 0.005 $\mu$m to 0.2 $\mu$m. This coating improves the adhesion between the substrate and the $MoS_x$-metal composite coating. Finally, the substrate is coated with the $MoS_x$-metal composite material in the second sputter station.

After all of the substrate has been coated, the ion source and sputter deposition sources are turned off, the sputter chamber is vented to atmospheric pressure, and the coiled, coated substrate is removed. A substrate having a solid thin coating within the scope of the present invention is obtained. The female or male electrical terminals can then be manufactured from this substrate using conventional methods, such as stamping and forming.

As taught by Spalvins in "Lubrication with Sputtered $MoS_2$ Films: Principles, Operation, and Limitations" JMEPEG, vol. 1, pp. 347–52 (1992), the COF decreases with increasing load, decreasing contact area and shear strength. As for electrical connectors, coatings or materials constituting both contact surfaces of female and male connectors also contribute to the friction force. Application of solid lubricant to only one of these surfaces can be sufficient to substantially reduce required insertion force. Additionally, since application to both surfaces can further decrease the insertion force, such application also is within the scope of this invention. Thin film coatings and/or coating configurations that can provide COF of preferably lower than about 0.2, more preferably lower than about 0.1, and most preferably lower than about 0.08, are within the scope of this invention. The CR also is affected by the coating configurations discussed above. Thin film coatings and/or coating configurations which can provide CR levels of preferably less than about 20 milliohms, more preferably less than about 10 milliohms, and most preferably less than about 8 milliohms, together with the low COF levels described above, are within the scope of this invention.

EXAMPLE 1

In this example, a thin strip sheet of C2600 brass (about 0.25 cm thick, about 3.2 cm wide, and about 60 cm long) and a coupon of borosilicate glass (about 0.1 cm thick, about 2.0 cm wide, and about 7.0 cm long) were used as substrate materials. Both substrates were pre-cleaned with acetone, a dilute solution of detergent, rinsed with deionized water, dried in an air stream, and placed on a moving stage in a sputter coating chamber. The cold trap was activated, and the chamber was evacuated to a pressure below $7.5 \times 10^{-4}$ millitorr. After this initial evacuation step, the pressure of the chamber was raised to about 25 millitorr by feeding the chamber with about 99.999 volume percent pure argon gas. Both substrates then were cleaned for about 10 minutes using a DC glow discharge of about 1,200 volts.

Next, the argon pressure was lowered to about 1.5 millitorr. The brass and the borosilicate substrates were moved linearly at a distance of about 5 cm above a titanium target that was about 99.995 weight percent pure titanium, having rectangular planar dimensions of about 12.5 cm width and about 20 cm length, provided by Pure Tech. This titanium target was driven by a DC sputtering power supply at a power density of about 0.8 W/cm$^2$, for about 60 seconds. This resulted in deposition of a titanium intermediate layer on the target.

Next, the MoS$_x$—Sn thin film was deposited on the titanium intermediate layer. The sputtering target used for this deposition was manufactured by hot-pressing a mixture of MoS$_2$ powder and tin powder at a temperature below about 232° C., to provide a target with a tin content of about 9 weight percent. This composite target having rectangular planar dimensions of about 12.5 cm width and about 20 cm length and was provided by Pure Tech. During the deposition of the coating, this target was driven by a DC sputtering power supply at a power density of about 2.8 W/cm$^2$. The deposition was achieved at about 1.5 millitorr argon pressure by steadily moving the brass and borosilicate substrates linearly at a distance of about 5 cm above the MoS$_2$—Sn target at a speed of about 3.81 cm/minute. This resulted in deposition of a MOS$_x$—Sn layer on the titanium intermediate layer.

The COF and the CR levels of the target then were determined by analyzing the MoS$_x$—Sn coating deposited on the brass substrate, whereas the coating that had been simultaneously deposited on the borosilicate substrate was used in the determination of the coating thickness. A thickness analysis performed using a stylus profilometer (Dektak, model number 3030ST, manufactured by Veeco Instruments) determined that a MoS$_x$—Sn composite coating with a thickness of about 0.85 μm was obtained on the borosilicate substrate. The COF of this coating on the brass substrate was measured by a tribometer manufactured by CSI instruments of Switzerland. Measurements were done by using a chromium-steel ball counterpart having a diameter of about 1.5 millimeter and by applying about 5 Newtons normal load to the ball, and moving the sample relative to the ball in a reciprocating mode for 10 cycles at an average speed of about 10 cm/minute. The CR of the MoS$_x$—Sn on the brass substrate was measured by applying an ASTM standard B 667-97 entitled "Standard practice for construction and use of a probe for measuring electrical contact resistance". This measurement was achieved using a platinum probe at about 10 mA with a normal load of about 5 Newtons. Using these measuring techniques, the CR of this coating was determined to be about 7 milliohms, and the COF to be about 0.09±0.02.

EXAMPLE 2

In this example, a thin sheet of C19210 copper alloy (about 0.03 cm thick, about 2 cm wide, and about 3 cm long) manufactured by Outokumpu Co. of Finland was used as a substrate material. This substrate was pre-cleaned as described in EXAMPLE 1. After this step, this substrate and a coupon borosilicate glass as described in EXAMPLE 1 were placed on a turntable in a sputtering chamber. Fine-cleaning was carried out using a glow discharge of argon as described in EXAMPLE 1.

After the glow discharge cleaning, the argon flow was stopped, the chamber was repumped, and an intermediate layer of chromium having a thickness of about 0.0078 μm was deposited on the substrate by filament evaporation of chromium (about 99.999 weight percent pure, provided by ESPI Inc. of U.S.A). The MoS$_x$—Sn thin film was deposited on the chromium intermediate layer using a MoS$_2$—Sn target as described in EXAMPLE 1, except that the target used in this example had a disk shape with a diameter of about 2.5 cm and a thickness of about 0.32 cm. This target was driven by a DC sputtering power supply at a power density of about 3.75 W/cm$^2$. The sputtering was continued for about 17 minutes at about 1.2 millitorr of argon pressure. During sputtering, the substrate was rotated at 15 RPM on a turntable placed about 5 cm beneath the target. The thickness of the MoS$_x$—Sn coating on the borosilicate glass coupon was determined by using the profilometer as described in EXAMPLE 1. The coating thickness was found to be about 0.2 μm. This coating was analyzed for its CR and COF levels as described in EXAMPLE 1. This coating yielded a CR value of about 3.3 milliohms and the COF value of about 0.06±0.02.

Taken together, EXAMPLES 1 and 2 indicated that both the CR and the COF levels of the MoS$_x$—Sn thin film could be decreased by decreasing the coating thickness.

EXAMPLE 3

In this example, a thin sheet of C19700 copper alloy (about 0.03 cm thick, about 2 cm wide, and about 3 cm long) manufactured by Olin Co. of U.S.A. was used as a substrate material. This substrate was pre-cleaned as described in EXAMPLE 1. After this step, this substrate and a coupon borosilicate glass as described in EXAMPLE 1 were placed on a turntable in a sputtering chamber. Fine-cleaning was carried out using a glow discharge of argon as described in EXAMPLE 1.

After the glow discharge cleaning, an intermediate layer of titanium having a thickness of about 0.015 μm was deposited on the substrate by sputtering of a titanium target (about 99.9 weight percent pure, about 2.5 cm diameter and about 0.32 cm thick target, provided by Pure Tech). This deposition was performed at about 3 millitorr pressure and the substrate rotation speed of about 15 RPM. Two sputtering targets were used to deposit the MoS$_x$—Ti composite coating, one made of MoS$_2$ and the other made of titanium (both targets were about 99.9 weight percent pure, about 2.5 cm in diameter and about 0.32 cm thick targets, and provided by Pure Tech). The MoS$_2$ target was powered at about 3.75 W/cm$^2$ and the titanium target at about 1.00 W/cm$^2$ simultaneously, as the substrates were rotated at a speed in the range of 12 RPM to 15 RPM on a turntable placed about 5 cm beneath the targets, for about 73 minutes.

The titanium content of the film was determined by energy-dispersive X-ray analysis (using a scanning electron microscope, model number JSM-6401F manufactured by JEOL of Japan equipped with an X-ray detector, model number 6925, manufactured by Oxford Instruments of England). This coating was found to have a titanium content of about 10 weight percent. The thickness of the MoS$_x$—Ti coating on the glass coupon—was determined using the profilometer as described in EXAMPLE 1. This coating was analyzed for its CR and COF levels as described in EXAMPLE 1. About 1.24 sum thick coating of this composite yielded a CR level of about 8 milliohms and the COF level of about 0.12±0.02.

This coating was found to have slightly higher COF than the MoS$_x$—Sn composites of EXAMPLE 1 and EXAMPLE 2. In general, MoS$_x$—Ti composites are less desirable for use in applications in which a combination of electrical conductivity and low friction is important. This is because of the pronounced ability of titanium to combine with water and oxygen during the deposition process or from the environment after deposition, leading to oxidized titanium, causing increase of the COF and CR. However, MoS$_x$—Ti composites or in general, MoS$_x$-metal composites can be useful for electrical connectors used in services in which wear resistance is as important as low friction and low contact resistance.

COMPARATIVE EXAMPLE 1

In this comparative example, a thin sheet of C19700 copper alloy (about 0.03 cm thick, about 2 cm wide, and about 3 cm long) manufactured by Olin Co. was used as a substrate material. This substrate was pre-cleaned as described in EXAMPLE 1. After this step, this substrate and a coupon borosilicate glass as described in EXAMPLE 1 were placed on a turntable in a sputtering chamber. Fine-cleaning was carried out by a glow discharge of argon as described in EXAMPLE 1.

After the glow discharge cleaning, the argon flow was stopped, the chamber was repumped, and an intermediate layer of chromium having a thickness of about 0.0078 µm was deposited on the substrate by filament evaporation of chromium (about 99.999 weight percent pure, provided by ESPI Inc.). This deposition was performed at a substrate rotation speed in the range of 12 RPM to 15 RPM. Two sputtering targets were used to deposit the MoS$_x$—Sn composite coating, one made of MoS$_2$ and the other made of tin (both targets were about 99.9 weight percent pure, about 2.5 cm diameter and about 0.32 cm thick targets, and provided by Pure Tech). The MoS$_2$ target was powered at about 3.75 W/cm$^2$ and the tin target at about 1.35 W/cm$^2$ simultaneously, as the substrates rotated in the range of 12 to 15 RPM on a turntable placed about 5 cm beneath the targets, for about 29 minutes.

The tin content of the MoS$_x$—Sn coating was determined using X-ray fluorescence analysis (using an X-Ray fluorescence spectrometer manufactured by Rigaku, model number ZSX). This coating was found to have a tin content of about 41 weight percent. The thickness of the MoS$_x$—Sn coating on the glass coupon was determined using the profilometer as described in EXAMPLE 1. This coating also was analyzed for its CR and COF levels as described in EXAMPLE 1. A coating about 0.77 µm thick yielded a CR level of about 8 milliohms and a COF in the range of 0.5 to 1.3. During the COF test, the coating was found to be ineffective at providing low friction. During the test, the chromium-steel ball either punched through the coating, or it caused considerable loss of coating material. This comparative example demonstrated that mechanically poor coatings are obtained at high tin concentrations.

Although the invention has been disclosed in detail with reference only to the preferred terminal coatings and methods of preparation, those skilled in the art will appreciate that additional coatings and methods fall within the scope of the invention.

What is claimed is:

1. An electrical connector comprising a male terminal and a female terminal, the male and female terminals each comprising a substrate material, wherein:
   the male and female terminals each comprise contact surfaces, and at least a portion of the contact surfaces of the female terminal or the male terminal are coated by a solid thin film comprising an atomic or molecular composite of MoS$_x$ and metal, wherein "x" is the atomic ratio of sulfur to molybdenum in the MoS$_x$-metal composite material.

2. An electrical connector as defined in claim 1, wherein at least a portion of the contact surfaces of the male terminal is coated by the solid thin film.

3. An electrical connector as defined in claim 1, wherein the substrate material is selected from the group consisting of copper, copper alloy, tin-plated copper, tin plated copper alloy, tin alloy-plated copper, tin alloy-plated copper alloy, tin-plated brass, nickel-plated copper, nickel-plated copper alloy, nickel-plated brass, brass, silver, nickel, iron-nickel alloy, and silver-nickel alloy.

4. An electrical connector as defined in claim 3 wherein the substrate material is selected from the group consisting of copper, copper alloy, tin-plated copper, and tin-plated copper alloy.

5. An electrical connector as defined in claim 1, wherein the substrate material is in the form of a strip, and the male terminal or female terminal is prepared using forming or stamping of the substrate material.

6. An electrical connector as defined in claim 1, wherein x has a value from about 1.0 to about 2.0.

7. An electrical connector as defined in claim 1, wherein the MoS$_x$-metal composite material contains a metal selected from the group consisting of tin, titanium, zirconium, chromium, cobalt, nickel, tungsten, tantalum, niobium, hafnium, and alloys thereof.

8. An electrical connector as defined in claim 7, wherein the metal is tin.

9. An electrical connector as defined in claim 7, wherein the solid thin film comprises between about 2 weight percent and about 20 weight percent metal.

10. An electrical connector as defined in claim 9, wherein the solid thin film comprises between about 2 weight percent and about 14 weight percent metal.

11. An electrical connector as defined in claim 1, wherein the thickness of the solid thin film is between about 0.05 µm and about 2.0 µm.

12. An electrical connector as defined in claim 11, wherein the thickness of the solid thin film is between about 0.1 µm and about 1.0 µm.

13. An electrical connector as defined in claim 1, wherein the at least a portion of the contact surfaces of the female terminal or the male terminal are further coated by a thin intermediate metal layer deposited between the contact surfaces and the solid thin film of the MoS$_x$-metal composite.

14. An electrical connector as defined in claim 13, wherein the thin intermediate metal layer comprises a metal selected from the group consisting of titanium, chromium, and zirconium.

15. An electrical connector as defined in claim 14, wherein the thin intermediate metal layer comprises titanium or chromium.

16. An electrical connector as defined in claim 13, wherein the thin intermediate metal layer has a thickness between about 0.005 µm and about 0.2 µm.

17. An electrical connector as defined in claim 1, wherein the solid thin film has a coefficient of friction of less than about 0.2 at a normal load of about 5 Newtons.

18. An electrical connector as defined in claim 17, wherein the solid thin film has a coefficient of friction of less than about 0.1 at a normal load of about 5 Newtons.

19. An electrical connector as defined in claim 18, wherein the solid thin film has a coefficient of friction of less than about 0.08 at a normal load of about 5 Newtons.

20. An electrical connector as defined in claim 1, wherein the solid thin film has a contact resistance of less than about 20 milliohms at a normal load of about 5 Newtons.

21. An electrical connector as defined in claim 20, wherein the solid thin film has a contact resistance of less than about 10 milliohms at a normal load of about 5 Newtons.

22. An electrical connector as defined in claim 21, wherein the solid thin film has a contact resistance of less than about 8 milliohms at a normal load of about 5 Newtons.

23. A method for making an electrical connector comprising a male terminal and a female terminal, the male and female terminals each comprising a substrate material and contact surfaces, wherein at least a portion of the contact surfaces of the female terminal or the male terminal are coated by a solid thin film comprising a $MoS_x$-metal composite material, wherein "x" is the atomic ratio of sulfur to molybdenum in the $MoS_x$-metal composite material, the method comprising:
  pre-cleaning the substrate material;
  placing the substrate material in a vacuum deposition chamber having a refrigerated trap;
  evacuating the vacuum deposition chamber to a pressure less than about $7.5 \times 10^-$ millitorr;
  cooling the refrigerated trap to a temperature less than 150 Kelvin; and
  coating the substrate material with the $MoS_x$-metal composite material to form a solid thin film having a predetermined thickness.

24. A method as defined in claim 23, wherein the vacuum deposition chamber comprises at least one sputter deposition source.

25. A method as defined in claim 24, wherein the vacuum deposition chamber is equipped to provide for continuous motion of the substrate material relative to the at least one sputter deposition source.

26. A method as defined in claim 23, wherein the step of coating comprises using a physical vapor deposition process to coat the substrate material with the $MoS_x$-metal composite material.

27. A method as defined in claim 26, wherein the step of coating comprises sputtering from at least one target to coat the substrate material with the $MoS_x$-metal composite material.

28. A method as defined in claim 27, wherein the step of depositing comprises using a balanced planar magnetron to coat the substrate material with the $MoS_x$-metal composite material.

29. A method as defined in claim 27, wherein the step of depositing comprises powering the sputter deposition source in the chamber by direct current, mid-frequency alternating current, alternating current, pulsed current, radio frequency, or microwave energy.

30. A method as defined in claim 29, wherein the step of powering comprises powering by direct current or mid-frequency alternating current.

31. A method as defined in claim 30, wherein the step of powering comprises powering by direct current.

32. A method as defined in claim 27, wherein the step of coating comprises sputtering from a single target consisting essentially of $MoS_2$-metal composite material.

33. A method as defined in claim 27, wherein the step of coating comprises sputtering simultaneously from at least one target consisting essentially of $MoS_2$ and at least one target consisting essentially of metal.

34. A method as defined in claim 27, wherein the step of coating comprises sputtering from at least one target consisting essentially of molybdenum or $MoS_2$, and at least one target consisting essentially of metal sulfide.

35. A method as defined in claim 32, wherein the step of coating comprises sputtering from a target prepared by hot pressing of $MoS_2$ powder along with a metal powder or metal sulfide powder.

36. A method as defined in claim 35, wherein the step of sputtering comprises sputtering from a target prepared by hot pressing of $MoS_2$ powder along with tin powder at a temperature below about 232° C.

37. A method as defined in claim 35, wherein the step of sputtering comprises sputtering from a target prepared by hot pressing of $MoS_2$ powder along with a powder of SnS or $SnS_2$.

38. A method as defined in claim 27, wherein the step of coating comprises providing a power density at the at least one target in the range of 2 $W/cm^2$ to 12 $W/cm^2$.

39. A method as defined in claim 27, wherein the step of coating comprises admitting argon to the chamber in an amount sufficient to increase the chamber pressure to a level between 0.25 millitorr and 7.5 millitorr.

40. A method as defined in claim 39, wherein the step of admitting argon comprises admitting argon in an amount sufficient to increase the chamber pressure to a level between 0.5 millitorr and 3.0 millitorr.

41. A method as defined in claim 40, wherein the step of admitting argon comprises admitting argon in an amount sufficient to increase the chamber pressure to a level between 0.75 millitorr and 1.5 millitorr.

42. A method as defined in claim 23, wherein the step of coating comprises coating using a reactive deposition process.

43. A method as defined in claim 42, wherein the step of coating using a reactive deposition process comprises using a process in which deposition is from reaction of a gaseous sulfur compound with molybdenum and the metal target.

44. A method as defined in claim 43, wherein the gaseous sulfur compound is $H_2S$ or a vapor of elemental sulfur.

45. A method as defined in claim 23, wherein the predetermined thickness is between about 0.05 $\mu$m and about 2.0 $\mu$m.

46. A method as defined in claim 45, wherein the predetermined thickness is between about 0.1 $\mu$m and about 1.0 $\mu$m.

47. A method as defined in claim 23, wherein the method further comprises a step of coating the substrate material with chromium, titanium, or zirconium to form a thin intermediate metal layer having a predetermined thickness, before the step of coating the substrate material with the solid thin film of $MoS_x$-metal composite material.

48. A method as defined in claim 47, wherein the predetermined thickness of the thin intermediate metal layer is between about 0.005 $\mu$m and about 0.2 $\mu$m.

49. A method as defined in claim 23, wherein the method further comprises using an ion source for fine-cleaning the substrate by bombarding the substrate with $Ar^+$ ions before the step of coating the substrate material with the $MOS_x$-metal composite material.

50. A method as defined in claim 23 wherein the substrate material is in the form of a thin strip.

51. A method for making an electrical connector comprising a male terminal and a female terminal, the male and female terminals each comprising a substrate material and contact surfaces, wherein at least a portion of the contact surfaces of the female terminal or the male terminal are coated by a solid thin film comprising a $MoS_x$—Sn composite material, wherein "x" is the atomic ratio of sulfur to molybdenum in the $MoS_x$—Sn composite material, the method comprising:
  providing the substrate material in the form of a thin strip;
  pre-cleaning the substrate material;
  placing the substrate material in a vacuum deposition chamber having a refrigerated trap;

evacuating the vacuum deposition chamber to a pressure less than about $7.5 \times 10^{-4}$ millitorr;

cooling the refrigerated trap of the chamber to a temperature less than 150 Kelvin;

admitting argon in the chamber in an amount sufficient to increase the pressure in the vacuum deposition chamber to a level between 0.25 millitorr and 7.5 millitorr;

fine-cleaning the substrate material by bombarding the substrate material with $Ar^+$ ions;

coating the substrate material with titanium or chromium to form a thin intermediate metal layer having a thickness between 0.005 μm and 0.2 μm; and coating the substrate material using sputter deposition from a balanced planar magnetron with a $MoS_2$—Sn composite target composite material to form solid thin film having a thickness between 0.1 μm and 1.0 μm, wherein the $MoS_2$—Sn composite target is manufactured by hot pressing of $MoS_2$ powder and tin powder at a temperature below 232° C., and wherein the magnetron is powered by a direct current power supply at a power density between 2 $W/cm^2$ and 12 $W/cm^2$.

* * * * *